United States Patent [19]

Hirata

[11] Patent Number: 5,747,119
[45] Date of Patent: May 5, 1998

[54] VAPOR DEPOSITION METHOD AND APPARATUS

[75] Inventor: Noriyuki Hirata, Ayase, Japan

[73] Assignee: Kabushiki Kaisha Toshiba, Kawasaki, Japan

[21] Appl. No.: 592,614

[22] Filed: Jan. 26, 1996

Related U.S. Application Data

[63] Continuation of Ser. No. 318,635, filed as PCT/JP94/00171 Feb. 4, 1994 published as WO94/18358 Aug. 18, 1994, abandoned.

[30] Foreign Application Priority Data

Feb. 5, 1993 [JP] Japan ................... 5-018930

[51] Int. Cl.$^6$ .................... C23C 16/22; C23C 16/46
[52] U.S. Cl. .................. 427/585; 427/248.1; 427/255; 427/255.7; 427/588
[58] Field of Search .................... 427/248.1, 255, 427/255.7, 573, 585, 588, 109, 166; 118/719

[56] References Cited

U.S. PATENT DOCUMENTS

| | | | |
|---|---|---|---|
| 4,328,258 | 5/1982 | Coleman | 118/50.1 |
| 4,675,206 | 6/1987 | Ikegaya et al. | 427/588 |
| 4,773,355 | 9/1988 | Reif et al. | 118/719 |
| 4,911,103 | 3/1990 | Davis et al. | 118/725 |
| 5,151,305 | 9/1992 | Matsumoto et al. | 427/252 |
| 5,230,925 | 7/1993 | Ohmine | 427/255.3 |

FOREIGN PATENT DOCUMENTS

| | | |
|---|---|---|
| 0114229 | 6/1985 | European Pat. Off. |
| 6425423 | 1/1989 | Japan |

OTHER PUBLICATIONS

The Encyclopedia American V. 12, Int. Ed. pp. 318–320 (1978).

The Encyclopedia American, vol. 12, International Edition, pp. 318–320, 1978.

*Primary Examiner*—Michael Lusignan
*Assistant Examiner*—Fred J. Parker
*Attorney, Agent, or Firm*—Cushman Darby & Cushman IP Group of Pillsbury Madison & Sutro LLP

[57] ABSTRACT

A vapor deposition method for forming at least one thin film on a substrate, wherein the time required to control the temperature of a substrate is minimized and the need for additional heating and cooling chambers to change the substrate temperature is obviated. A carry-in/carry-out chamber, heating chamber, and first and second film forming heating chambers are arranged about and connected to a transfer chamber by respective gate valves. The apparatus provides for a continuous film-forming process to be carried out under different operating conditions by controlling at least one of the following parameters: evacuation times for the first and second film forming chambers, the time for transporting the substrate from the first to the second film forming chamber by a carrier mechanism, the pressure in the transfer chamber, the evacuation waiting time before the film forming step, and the material gases introducing and pressure adjusting time before the film forming step. Accordingly, the size and cost of the apparatus are decreased, while productivity is increased.

6 Claims, 6 Drawing Sheets

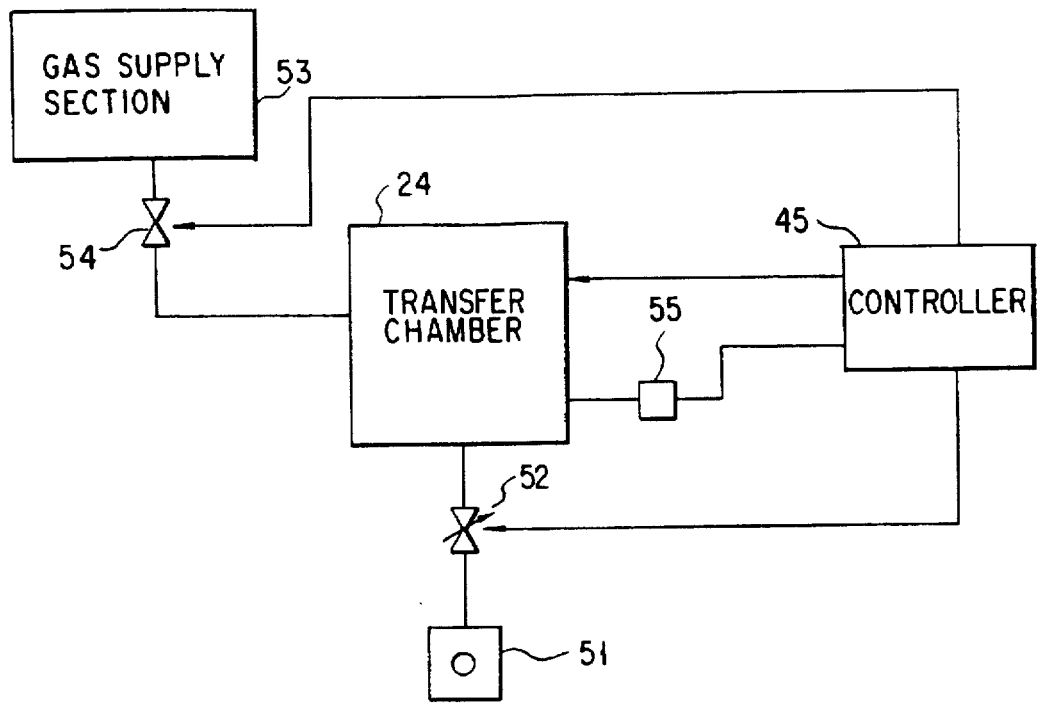
F I G. 3
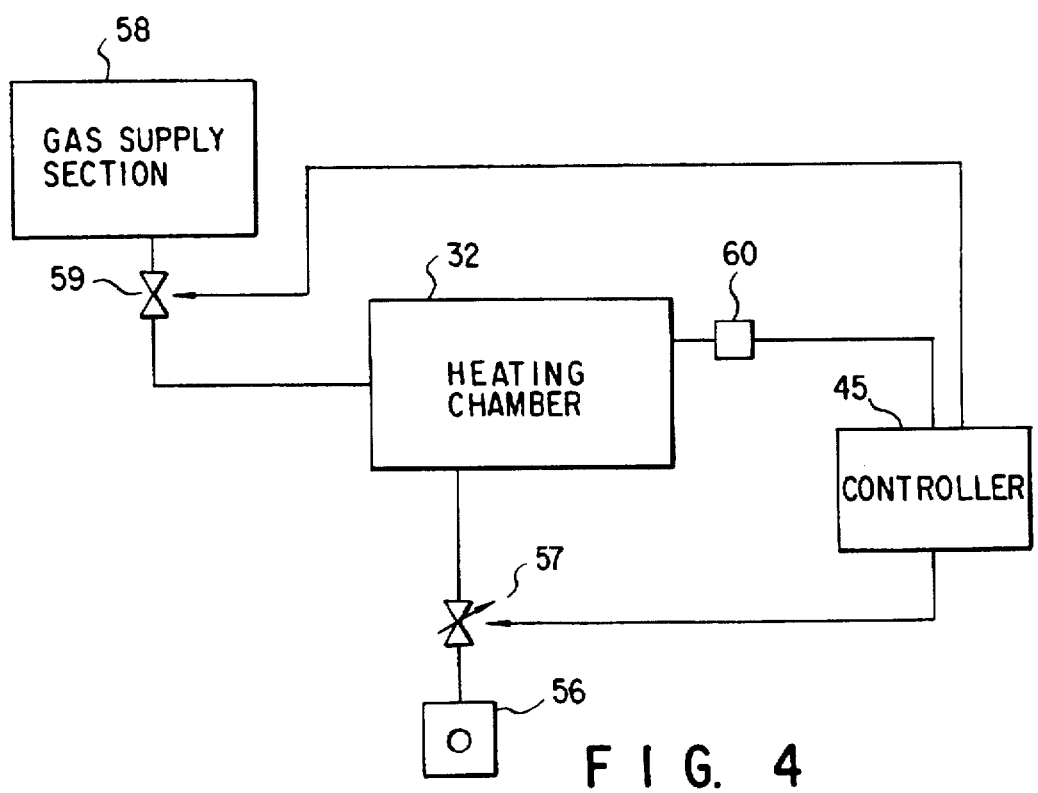
F I G. 4

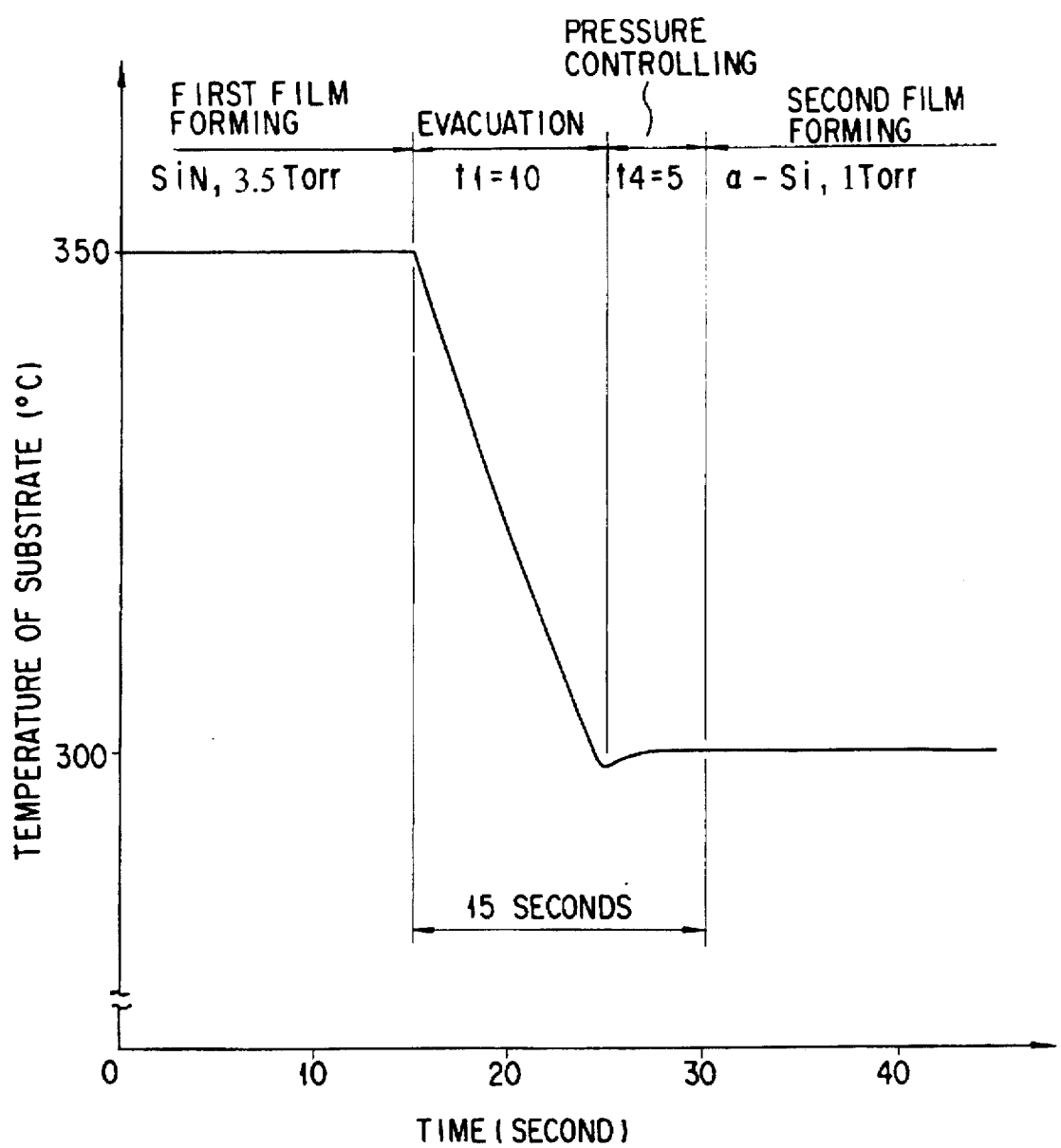
F I G. 7

5,747,119

1

VAPOR DEPOSITION METHOD AND APPARATUS

This is a continuation of application Ser. No. 08/318,635, filed as PCT/JP94/00171 Feb. 4, 1994 published as WO94/18358 Aug. 18, 1994, which was abandoned upon the filing hereof.

TECHNICAL FIELD

The present invention relates to a vapor deposition method of forming film on a substrate and it also relates to an apparatus for the same.

BACKGROUND ART

In the case where a thin film is formed on a substrate to make a thin film transistor, for example, the chemical vapor deposition (CVD) apparatus of the continuous in-line type as shown in FIG. 8 is usually used.

As shown in FIG. 8, this chemical vapor deposition apparatus has a gate valve 1, to which a carry-in chamber 2 is connected. A substrate is carried through the gate valve 1 to the carry-in chamber 2. A heating chamber 4 in which the substrate is heated is also connected to the carry-in chamber 2 by a gate valve 3. Further, a first film forming chamber 6 in which a thin film is formed on the substrate is connected to the heating chamber 4 by a gate valve 5. Cooling chamber 8 in which the heated substrate is cooled is connected to the first heating chamber 6 by a gate valve 7. Furthermore, a second film forming chamber 10 in which a thin film is again formed on the substrate is connected to the cooling chamber 8 by a gate valve 9 and a carry-out chamber 12 out of which the substrate is carried is connected to the second film forming chamber 10 by a gate valve 11. A gate valve 13 is attached to the other side of the carry-out chamber 12.

The substrate is set at first on a tray and carried into the carry-in chamber 2. The substrate is then carried into the heating chamber 4 while keeping the carry-in chamber 2 in a vacuum state, and the substrate is heated therein to a predetermined temperature and carried into the first film forming chamber 6. Material gas is introduced into the first film forming chamber 6 at a predetermined temperature to adjust the pressure in the first film forming chamber 6 and a thin film is formed on the substrate while adding high frequency current or the like thereto. After a thin film is thus formed on the substrate in the first film forming chamber 6, the chamber 6 is exhausted to set it in a vacuum state and the substrate is then carried into the cooling chamber 8. The substrate which has been carried into the cooling chamber 8 is cooled to a predetermined temperature and carried into the second film forming chamber 10. Material gas is introduced into the second film forming chamber 10 at a temperature lower than that in the first film forming chamber 6 to adjust pressure in the chamber 10. A thin film is again formed on the substrate while applying high frequency power or the like thereto. After a thin film is thus formed on the substrate in the second film forming chamber 10, the chamber 10 is exhausted to a vacuum state and the substrate is carried into the carry-out chamber 12. Pressure in the chamber 12 is then returned to atmospheric pressure and the film-formed substrate is carried out of the chamber 12 through the gate valve 13.

In a case where films are continuously formed on the substrate under two or more different process conditions, however, a cooling or heating chamber used to change substrate temperature is needed between the first and the second film forming chambers, for example. It is also

2 necessary that temperatures of the substrate and the tray itself on which the substrate is set are made stable. Since, however, the tray, which is made of stainless steel, usually has a large heat capacity, as shown in FIG. 9, it takes a long time to stabilize the temperature of the substrate.

In the case where film forming is continuously carried out in a single film forming chamber under two or more different conditions, a long time is necessary to make the temperature of the substrate stable. Allowance for such time demands under a continuous process is impossible or impractical.

In the case where a plurality of film forming chambers are used, heating or cooling chambers used to change the temperature of the substrate are needed between the first and the second film forming chambers and between the other chambers. This makes the cost of the apparatus high. In addition, the apparatus becomes large in size and the space which the apparatus occupies also becomes large. Further, it takes a long time to change and stabilize the temperature of the substrate. This makes the productivity of the apparatus low.

The present invention is therefore intended to eliminate the above-mentioned drawbacks. Accordingly, it is an object of the present invention is to provide a chemical vapor deposition method and apparatus capable of making it unnecessary to use any heating and cooling chambers to change the temperature of the substrate. It is another object of the present invention to control the temperature of the substrate in a very short time, making the apparatus low in cost, and making the apparatus small in size and high in productivity.

DISCLOSURE OF THE INVENTION

A vapor deposition method is disclosed, whereby substrates are carried in-and-out one-by-one and a thin film is formed on the substrate in film forming chambers provided with substrate heating heaters. The heating temperature of each heater is made constant and the temperature of the substrate is controlled while controlling at least either the pressure set in each film forming chamber or the time needed to carry the substrate.

A vapor deposition method is disclosed whereby a plurality of different film layers are successively formed on a substrate in heater-provided film forming chambers. The heaters control substrate temperature while pressure is controlled in each film forming chamber.

The vapor deposition method is intended to keep the temperature of each heater constant, even while the substrate temperature is controlled.

The vapor deposition method is further intended to provide a substrate heating heater having a heat capacity larger than that of the substrate.

The vapor deposition method is also intended to provide a clearance between the substrate and each substrate heating heater.

A vapor deposition apparatus includes a carry-in chamber into which a substrate is carried, a transfer chamber provided with a carrier mechanism for individually carrying the substrates, a heating chamber in which the substrate is heated, one or more film forming chambers in which thin film is formed on the substrate, and a carry-out chamber from which the film-formed substrate is carried. The apparatus includes control means for controlling the temperature of the substrate, while controlling the exhausting time or the pressure set before and after film forming is started in each film forming chamber. The pressure is set when film forming is being carried out in the film forming chamber. The time needed to carry the substrate, and the pressure in the transfer chamber is controlled for the film forming chambers.

The vapor deposition apparatus is intended to add a substrate heating heater to each film forming chamber.

The vapor deposition apparatus is also intended to keep constant the heating temperature of the heater attached to the film forming chamber.

The vapor deposition apparatus is further intended to continuously carry out plural thin film forming processes under different process conditions while successively controlling the temperature of the substrate in one film forming chamber.

The vapor deposition apparatus is intended to include at least a layer of thin semiconductor film among layers of thin films which are formed on the substrate.

The vapor deposition apparatus can use a glass substrate.

According to the vapor deposition method, the substrates are individually carried. A tray is thus unnecessary. When the substrate has a small heat capacity, less time is required to change the substrate temperature. In addition, the temperature is controlled while keeping the heating temperature of the heater certain and controlling the pressure set in the film forming chamber or the time needed to carry the substrate. This makes it unnecessary to heat and cool the substrate directly. The cost of forming a thin film on the substrate can thus be made lower and the temperature of the substrate can be changed more easily.

According to the vapor deposition method, the temperature of the substrate may be controlled and adjusted while controlling the pressure set in the film forming chamber. In short, the temperature of the substrate is changed while controlling the pressure. Although the substrate heating heater has a large heat capacity, the substrate temperature can be changed in a short time.

According to the vapor deposition method, the temperature of the substrate heating heater is made constant when the substrate is to be controlled to a different temperature. The heating temperature of the heater attached to the film forming chamber is thus made constant and substrate temperature is changed while keeping constant the heating temperature of the heater, which has a relatively large heat capacity. Therefore, substrate temperature can be changed in a shorter time.

According to the vapor deposition method, the heat capacity of the substrate heating heater is larger than that of the substrate. When pressure is changed in the film forming chamber, therefore, the temperature of the substrate is more easily changed than the temperature of the heater. This means that substrate temperature can be changed more easily.

According to the vapor deposition method, a clearance is provided between the substrate and the substrate heating heater. The atmosphere surrounding the substrate thus changes more quickly in temperature than the substrate heating heater. Accordingly, substrate temperature can be more easily and quickly changed by controlling the surrounding atmosphere.

According to the vapor deposition apparatus no tray is required to carry the substrate. Heat capacity can be made smaller and substrate temperature can be more easily changed in a shorter time. In addition, substrate temperature is controlled by controlling at least one of the following: the exhausting time and the pressure set before and after film forming is started in the film forming chamber, the pressure set when film forming is being carried out in the film forming chamber, the time needed to carry the substrate, and the pressure in the transfer chamber. Therefore, additional separate heating and cooling chambers are not needed to change the temperature of the substrate and substrate temperature control is made possible in a shorter time. Further, plural film forming processes can be continuously carried out under different process conditions in a single film forming chamber. The apparatus can thus be made lower in cost, smaller in size and higher in productivity than known devices.

According to the vapor deposition apparatus, the film forming chamber has a substrate heating heater to heat the substrate. This enables the film forming chamber to be heated to any optional temperature.

According to the vapor deposition apparatus, the heating temperature of the substrate heating heater attached to the film forming chamber is kept certain. Also, the substrate temperature is changed while keeping constant the heating temperature of the heater, which has a relatively large heat capacity, in this manner. Substrate temperature can be thus changed in a shorter time.

According to the vapor deposition apparatus, plural thin film forming processes are continuously carried out under different process conditions in a single film forming chamber while successively controlling the temperature of the substrate in the chamber. Thin film layers of different kinds can thus be more easily formed on the substrate in the single film forming chamber.

According to the vapor deposition apparatus, at least a layer of thin semiconductor film is included in those layers of thin film which are formed on the substrate. This enables semiconductor products to be more easily made.

According to the vapor deposition apparatus, the substrate is a glass one. The glass substrate has a low heat efficiency, and causing temperature gradient to be present in the substrate. Temperature control can be thus realized relative to the substrate by surrounding atmosphere.

BRIEF DESCRIPTION OF THE DRAWINGS

FIG. 3 is a block diagram showing a transfer chamber;

FIG. 4 is a block diagram showing a heating chamber;

FIG. 7 is a graph showing another change in substrate temperature;

BEST MODE OF CARRYING OUT THE INVENTION

The chemical vapor deposition apparatus according to an embodiment of the present invention will be described with reference to the accompanying drawings.

Figure 1:
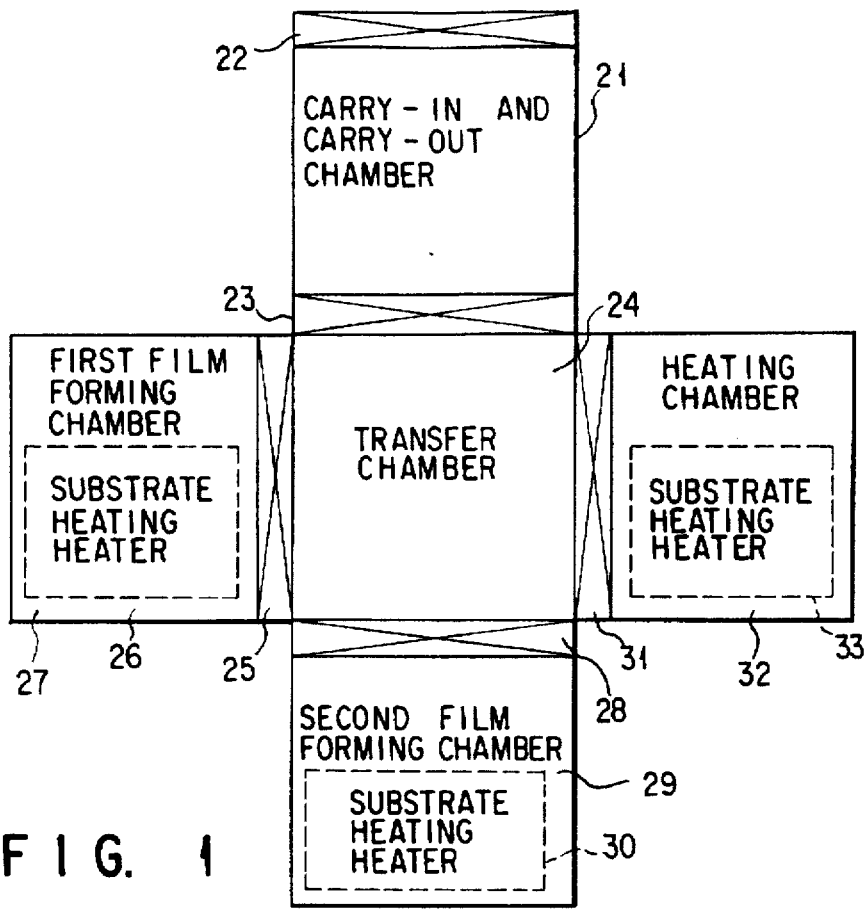
FIG. 1 is a block diagram showing the chemical vapor deposition apparatus according to an embodiment of the present invention.

In FIG. 1, reference numeral 21 represents a carry-in and -out chamber. A matrix array substrate B (FIG. 5), on which a thin film transistor (TFT) is to be formed, is carried into and out of the carry-in and -out chamber 21 and a gate valve 22 is attached to a side of the chamber 21 through which the substrate B is carried into and out of the chamber 21. A gate valve 23 is also attached to another side of the chamber 21 which is opposed to the gate-valve-attached side thereof. A transfer chamber 24 is connected to the carry-in and -out chamber 21 through the gate valve 23. The transfer chamber 24 has a single substrate carrying mechanism for carrying the substrates individually without using any tray.

A first film forming chamber 26 is connected to a side of the transfer chamber 24, which is different from the side thereof provided with the gate valve 23, through a gate valve 25. The first film forming chamber 26 has a substrate heating heater 27. A thin film is formed on the matrix array substrate B in substrate heating heater 27. A gate valve 28 is attached to a further side of the chamber 24 and a second film forming chamber 29 is connected to the chamber 24 through the gate valve 28. This second film forming chamber 29 also has a substrate heating heater 30. A thin film is formed on the matrix array substrate B in substrate heating heater 30. A gate valve 31 is also attached to a still further side of the chamber 24 and a heating chamber 32 is connected to the chamber 24 through the gate valve 31. This heating chamber 32 also has a substrate heating heater 33 to heat the matrix array substrate B.

Figure 2:
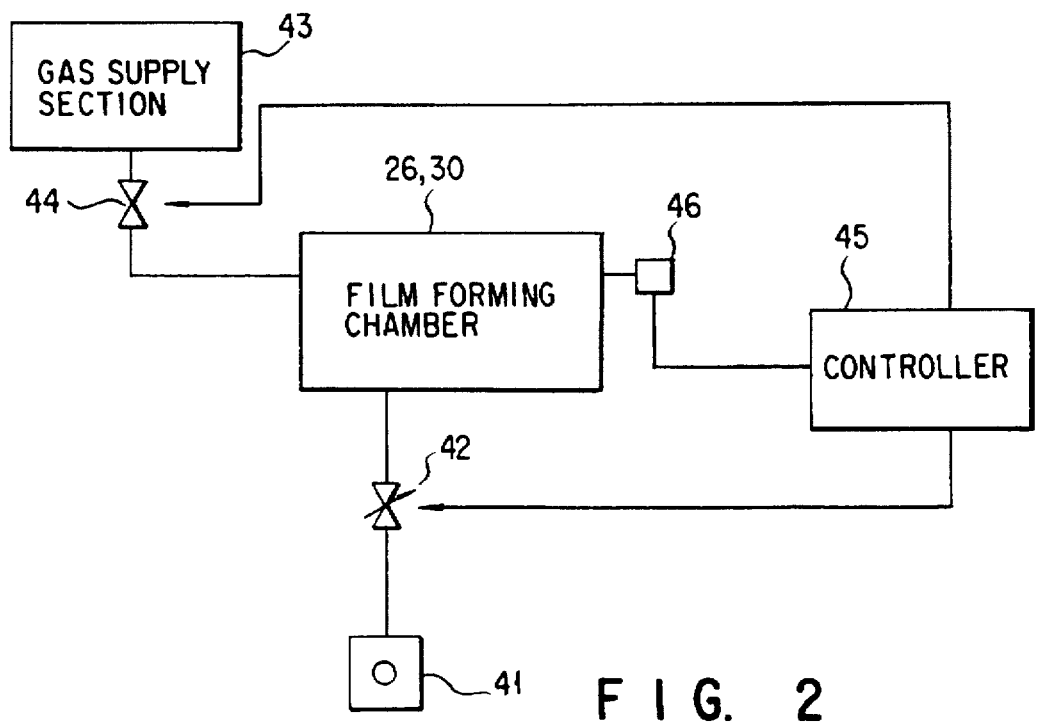
FIG. 2 is a block diagram showing first and second film forming chambers.

The first and second film forming chambers 26 and 29 are as shown in FIG. 2. A vacuum suction pump 41 is connected to each of the first and second film forming chambers 26 and 29 through a throttle valve 42 and a gas supply section 43 is also connected to the chamber 26, 29 through a switch valve 44. Further, a pressure sensor 46 is connected to chambers 26 and 29 and a controller 45 which serves as control means having a timer is connected to the pressure sensor 46. The controller 45 is also connected to and controls the throttle valve 42 and the switch valve 44.

The transfer chamber 24 is as shown in FIG. 3. A vacuum suction pump 51 is connected to the transfer chamber 24 through a throttle valve 52 and a gas supply section 53 is connected to chamber 24 through a switch valve 54. A pressure sensor 55 is connected to the transfer chamber 24 and the controller 45 is connected to the pressure sensor 55. The controller 45 is also connected to and controls the throttle valve 52 and the switch valve 54. The controller 45 also controls the substrate carrying speed.

The heating chamber 32 is as shown in FIG. 4. A vacuum suction pump 56 is connected to the heating chamber 32 through a throttle valve 57 and a gas supply section 58 is also connected to chamber 32 through a switch valve 59. A pressure sensor 60 is connected to it and the controller 45 is connected to the pressure sensor 60. The controller 45 is also connected to and controls the throttle valve 57 and the switch valve 59.

Figure 5:
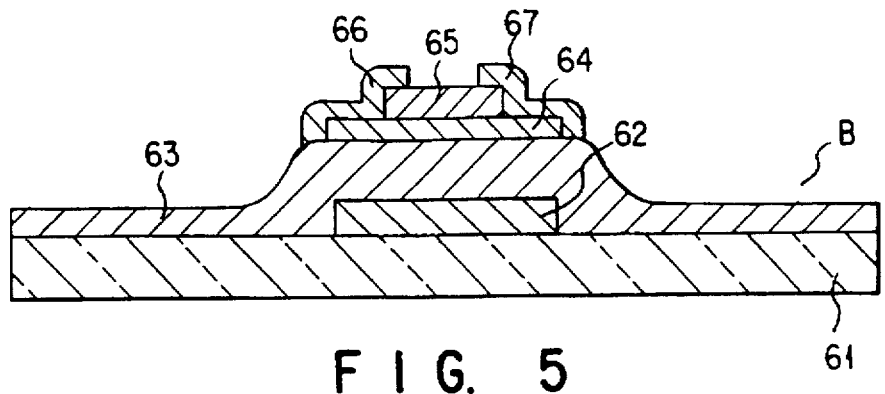
FIG. 5 is a sectional view showing a matrix array substrate which is being made.

As shown in FIG. 5, the matrix array substrate B comprises a glass substrate 61, a gate electrode 62 formed on the glass substrate 61, a gate insulator layer 63 formed on the glass substrate 61 and the gate electrode 62, semiconductor and etching stopper layers 64 and 65 formed above the gate electrode 62 with the gate insulator layer 63 interposed between them, and source and drain electrodes 66 and 67 formed on the semiconductor and etching stopper layers 64 and 65.

It will be described how the above-described chemical vapor deposition apparatus operates.

All of the gate valves 22, 23, 25, 28 and 31 are closed. Responsive to pressures detected by the pressure sensors 46, 55 and 60, the controller 45 opens the throttle valves 42, 52 and 57 to exhaust vacuum all of the chambers 26, 29 and 32 except the carry-in and -out chamber 21 through the suction pumps 41, 51 and 56 to reach the predetermined pressure. Substrate heating heaters 27, 33 and 30 which are attached to the first film forming chamber 26, the heating chamber 32 and the second film forming chamber 29, respectively, are previously heated to 420° C., 390° C. and 350° C., respectively, in vacuum.

The gate valve 22 of the carry-in and -out chamber 21 is opened and the glass substrate 61 for the matrix array substrate B or a cassette in which the glass substrate 61 for the matrix array substrate B is housed is set in the carry-in and -out chamber 21. The gate valve 22 is then closed and the carry-in and -out chamber 21 is evacuated from atmospheric pressure to a predetermined one by the suction pump (not shown). Thereafter, the gate valve 23 of the carry-in and -out chamber 21 which is located on the side of the transfer chamber 24, and the gate valve 31 of the heating chamber 32 are opened and the glass substrate 61 is carried from the carry-in and -out chamber 21 into the heating chamber 32 by the single-substrate carrying mechanism.

When the glass substrate 61 is carried into the heating chamber 32, the gate valve 31 of the heating chamber 32 is closed and the glass substrate 61 is heated to about 380° C. on the substrate heating heater 33 and held there. The glass substrate 61 is further raised in temperature for a predetermined time and after this temperature increase is finished, the throttle valve 57 for the suction pump 56 is opened to evacuate the heating chamber 32. The gate valves 31 and 25 of the heating and first film forming chambers 32 and 26 are then opened. The speed of the single substrate carrying mechanism in the carrier chamber 24 is controlled by the controller 45 and the glass substrate 61 is carried from the heating chamber 32 into the first film forming chamber 26.

When the glass substrate 61 is carried into the first film forming chamber 26, the gate valve 25 of the first film forming chamber 26 is closed and the controller causes the throttle valve 42 for the suction pump 41 to be opened to evacuate the first film forming chamber 26 for a predetermined time. The switch valve 44 for the gas supply section 43 is opened to introduce material gases such as monosilane ($SiH_4$), ammonia ($NH_3$) and nitrogen ($N_2$) into the first film forming chamber 26. The opening of the throttle valve 42 is controlled by the controller 45 to adjust pressure in the first film forming chamber 26 to a predetermined one of 1.5 Torr. High frequency power is then applied to generate discharge and the gate insulator layer 63 which is silicon nitride ($Si_xN_y$) film is formed on the entire surface of the glass substrate 61 having the gate electrode 62 formed thereon, at a temperature range of 300° C.–400° C., preferably at 350° C. X and y in silicon nitride ($Si_xN_y$) are usually replaced by 3 and 4 but the film of $Si_xN_y$ sometimes includes quite an amount of hydrogen (H) or oxygen (O) elements. The throttle valve 42 is regarded as being in an open position when it is made parallel or 180 degrees to the flow of gases and as being in a close position when the valve 42 is made perpendicular or 90 degrees to the flow. It is adjusted in a range of 90–180 degrees. Before the gate insulator layer 63 is formed on the glass substrate 61, a thin film is formed on the substrate 61 and then etched to form the gate electrode 62. When discharge is finished after a predetermined time period, the throttle valve 42 for the suction pump 41 is opened for a predetermined time $t_1$ to evacuate the first film forming chamber 26. Further, gate valves 25 and 28 of first and second film forming chambers 26 and 29 are opened and while controlling the speed of the single substrate carrying mechanism in the transfer chamber 24 through the controller 45, the glass substrate 61 having the gate insulator layer 63 formed thereon is carried from the first film forming chamber 26 into the second film forming chamber 29 at a time $t_2$ previously set by the controller 45.

When the glass substrate 61 having the gate insulator layer 63 formed thereon and serving as the matrix array substrate B is carried into the second film forming chamber 29, the gate valve 28 of the second film forming chamber 29 is closed and the throttle valve 42 for the suction pump 41 is opened for a time $t_3$ previously set to evacuate the second film forming chamber 29. The switch valve 44 for the gas supply section 43 is opened and material gases such as monosilane ($SiH_4$) and hydrogen ($H_2$) are introduced into the second film forming chamber 29. While detecting pressure in the chamber 29 through the pressure sensor 46, the opening degree of the throttle valve 42 is controlled to adjust the pressure in the chamber 29 to a predetermined one of 2 Torr in a previously-set time $t_4$. High frequency power is then applied to generate discharge and the semiconductor layer 64 which is amorphous silicon (a-Si) film is formed on the gate insulator layer 63 to a predetermined thickness in a temperature range of 250° C.–350° C., preferably at 300° C. After the semiconductor layer 64 is formed in this manner, the throttle valve 42 for the suction pump 41 is again opened to evacuate the second film forming chamber 29. The gate valve 28 of the second film forming chamber 29 and the gate valve 23, which is located on the side of the carry-in and -out chamber 21, are opened and the matrix array substrate B having laminated film layers formed in the second film forming chamber 29 is returned into the carry-in and -out chamber 21 by the single substrate carrying mechanism in the transfer chamber 24 one by one.

When the glass substrate 61 having the semiconductor layer 64 formed thereon and serving as the matrix array substrate B is carried into the first 26, the second 29 or other film forming chambers (not shown), the chamber is similarly evacuated and material gases such as monosilane ($SiH_4$), ammonia ($NH_3$) and hydrogen ($H_2$) are introduced into the chamber. After pressure in the chamber is adjusted to a predetermined one of 0.8 Torr, high frequency power is applied to generate discharge and the etching stopper layer 65, which is silicon nitride ($Si_xN_y$) film, is formed on the semiconductor layer 64 to a predetermined thickness in a temperature range of 250° C.–350° C., preferably at 290° C. After the etching stopper layer 65 is formed in this manner, the chamber is again evacuated and the glass substrate 61 is then returned into the carry-in and -out chamber 21.

After etching is carried out in a predetermined manner, source and drain electrodes 66 and 67 are formed on semiconductor layer 64.

The above-mentioned processes or steps can be continuously repeated.

Figure 6:
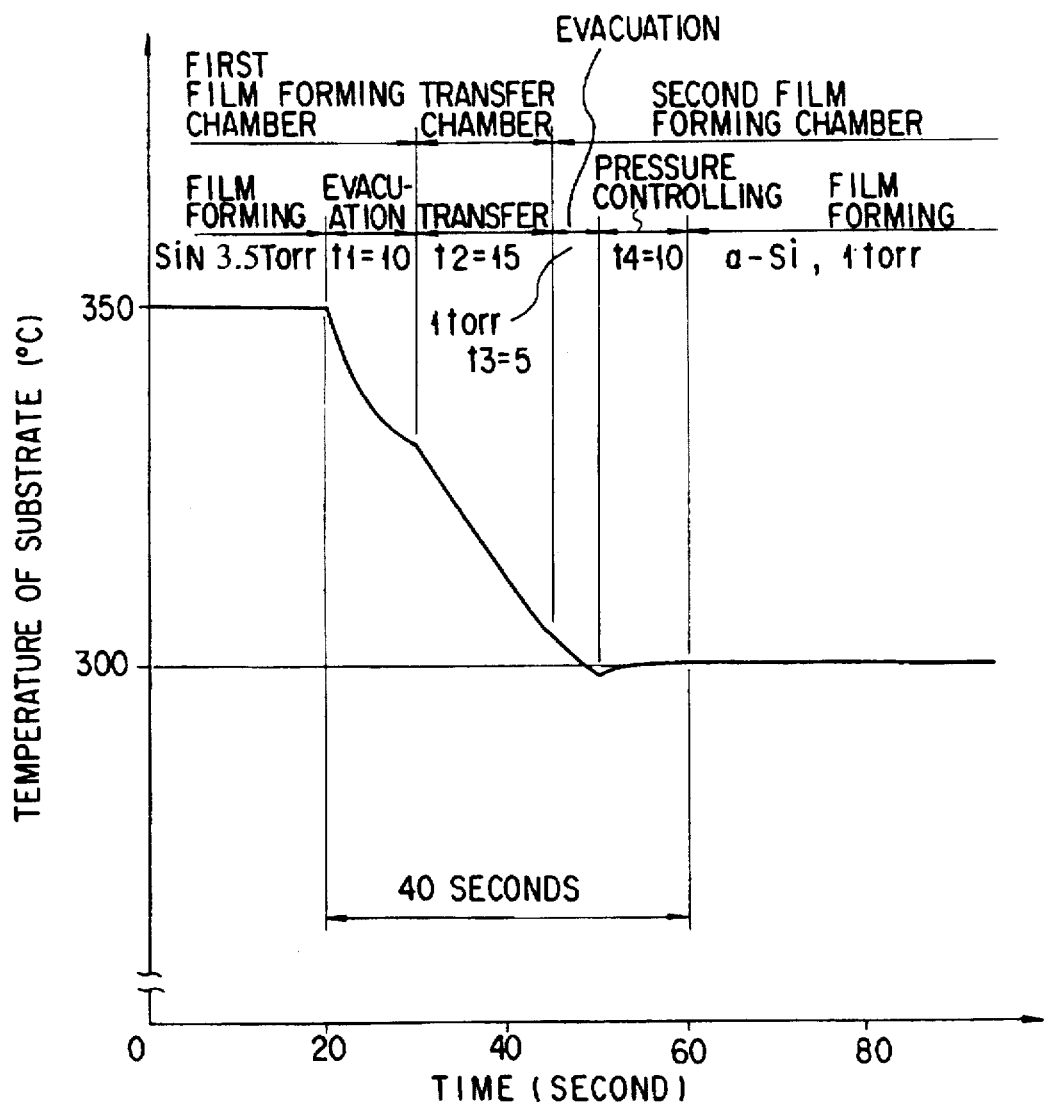
FIG. 6 is a graph showing a change in substrate temperature.
Figure 8:
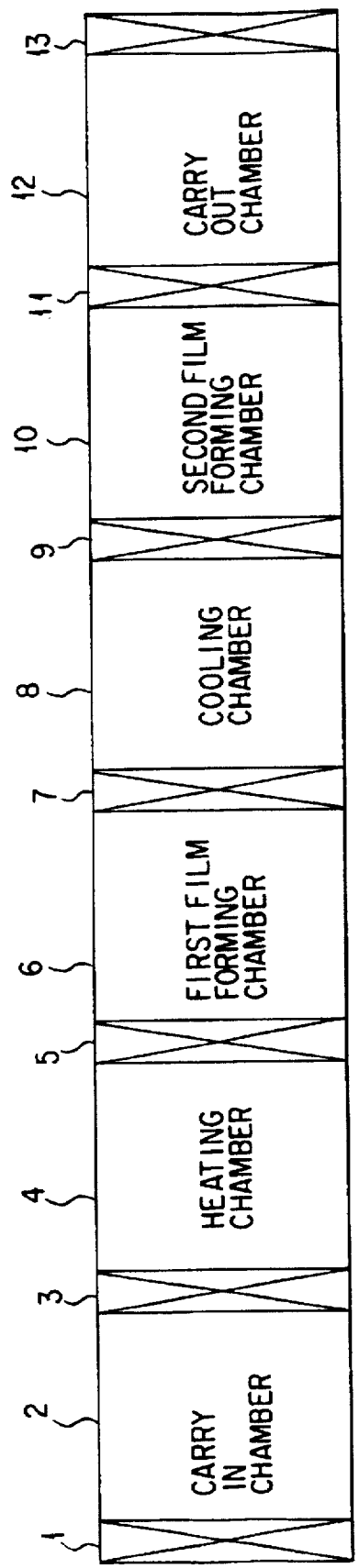
FIG. 8 is a block diagram showing the conventional chemical vapor deposition apparatus.
Figure 9:
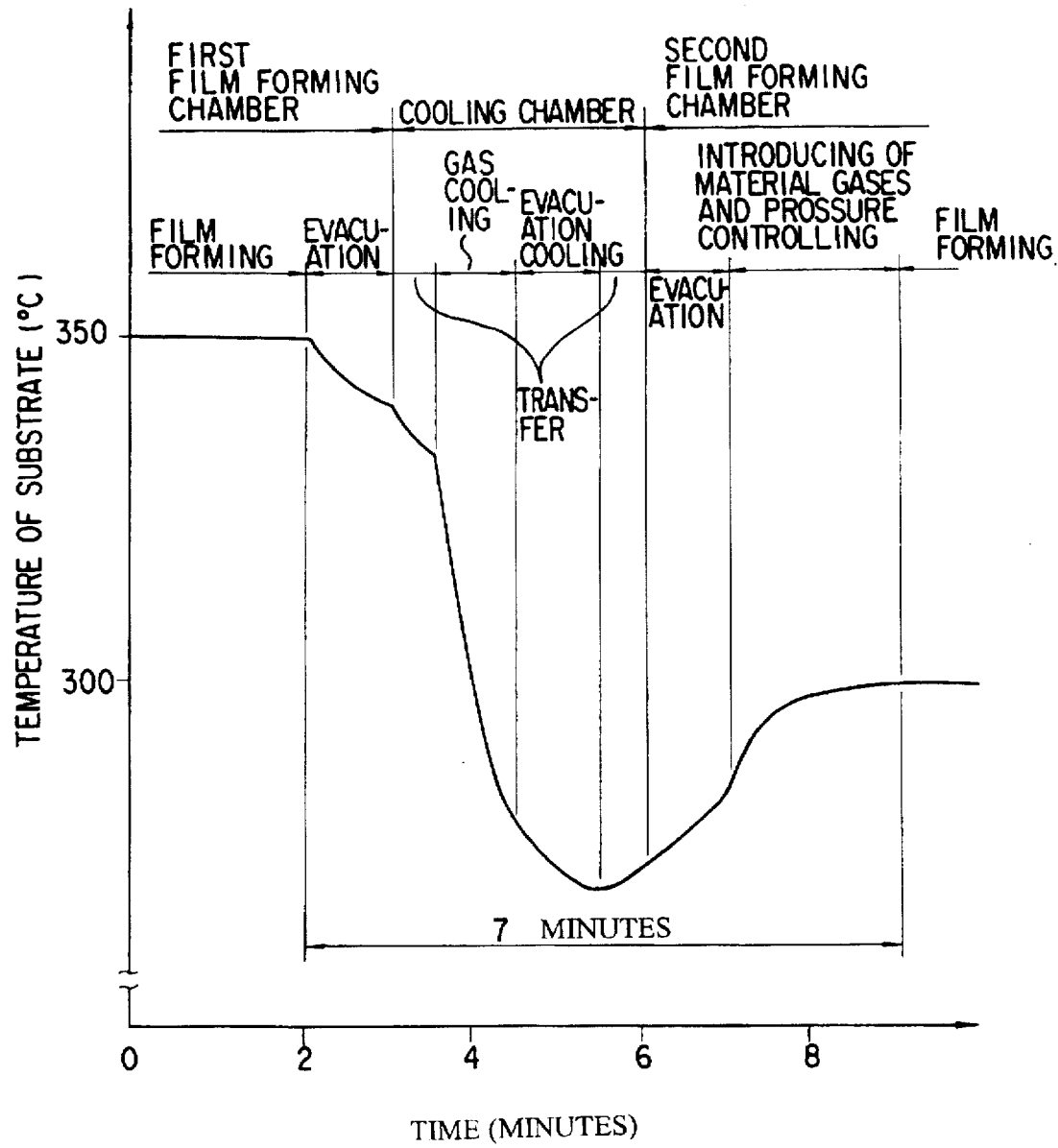
FIG. 9 is a graph showing a change in substrate temperature in the conventional chemical vapor deposition apparatus.

Temperature control will be described citing temperature change in the substrate shown in FIG. 6 wherein two film layers are formed on the substrate in the first 26 and the second film forming chambers 29.

After film forming is finished in the first film forming chamber 26, the throttle valve 42 for the suction pump 41 is opened by the controller 45 to evacuate the first film forming chamber 26 for the time $t_1$, during which substrate temperature is lowered by about 20° C. Responsive to pressure detected by the pressure sensor 55, pressure in the transfer chamber 24 is adjusted to 1 Torr for the time $t_2$, during which the substrate is carried from the first film forming chamber 26 into the second film forming chamber 29, by the controller 45. Substrate temperature is thus lowered by about 25° C. Substrate temperature is further lowered in the second film forming chamber 29 by 5° C. for the waiting time $t_3$ and the pressure adjusting time $t_4$ during which the switch valve 44 for the gas supply section 43 is opened to introduce material gases into the chamber 29.

The amount of time required to control the matrix array substrate temperature can be lessened by controlling (via controller 45), the following: the evacuating time $t_1$, in the first film forming chamber 26, the time $t_2$ needed to carry the substrate from the first 26 into the second film forming chamber 29, pressure in the transfer chamber 24 at the substrate carrying time $t_2$, the waiting time $t_3$ in the second film forming chamber 29, and the pressure adjusting time $t_4$ for introducing material gases into the second film forming chamber 29. The pressure adjusting can be conducted in a step-like manner.

Pressure at the time when film forming was carried out in the first film forming chamber 26 was 1.5 Torr, that in the transfer chamber 24 was 1 Torr, and that at the time when film forming was carried out in the second film forming chamber 29 was 2 Torr. Further, where $t_1$=10 sec., $t_2$=15 sec., $t_3$=5 sec., and $t_4$=10 sec., temperature control of the matrix array substrate B can be made in the shortest time of about 40 sec..

In the system for controlling substrate temperature while keeping the substrates on each of the substrate heating heaters 27 and 30, the temperature of the matrix array substrate B becomes low on the high vacuum side and high on the low vacuum side when the substrate heating heaters 27 and 30 are set of the same temperature. This becomes more remarkable when the clearance between the matrix array substrate B and each of the substrate heating heaters 27 and 30 is smaller than 0.3 mm, and temperature changes depending upon the kind of gas present in the clearance. When adjusting pressure when the film forming is selected, therefore, film forming is made possible at a desired substrate temperature.

On the other hand, the temperature of the matrix array substrate B becomes different, depending upon the kinds of gases used in the film forming, even though the substrate heating heaters 27 and 30 are set at the same temperature. In a case where a $Si_xN_y$ film is formed under 3.5 Torr and a a-Si film under 1 Torr, while setting the substrate heating heaters 27 and 30 at a temperature of 390° C., for example, the $Si_xN_y$ film can be formed when the temperature of the matrix array substrate B is 350° C. and the a-Si film when it is 300° C.

In the case where film forming is continuously applied to the matrix array substrate B under two or more different process conditions in the first and second film forming chambers 26 and 29, therefore, the time required to control the temperature of the matrix array substrate B can be shortened by controlling the following parameters: pressure at the pressure adjusting in the first film forming chamber 26, the evacuating time and the value of pressure set after the film forming step, the time needed to carry the matrix array substrate B from the first film forming chamber 26 into the second film forming chamber 29 and pressure at this time, the waiting time and the value of pressure set until material gases are introduced into the second film forming chamber 29 to adjust pressure in chamber 29, and the value of pressure set at this pressure adjusting time.

Another embodiment of the present invention wherein different laminated film forming processes are carried out in the first film forming chamber 26 will be described. Parallel processes are also similarly carried out in the second film forming chamber 29.

The substrate heating heater 27 in the first film forming chamber 26 is previously set at 390° C. Gate valves 23 and 31 of carry-in and -out and heating chambers 21 and 32 are opened. The glass substrate 61 having the gate electrode 62 formed thereon and serving as the matrix array substrate B is carried into the heating chamber 32 by the single substrate carrying mechanism in the transfer chamber 24 and heated to about 380° C. Gate valves 31 and 25 of heating and first film forming chambers 32 and 26 are opened. Then the substrate, which has been heated to about 380° C. in the heating chamber 32, is carried from the heating chamber 32 into the first film forming chamber 26 by the single substrate carrying mechanism in the transfer chamber 24.

When the substrate is carried into the first film forming chamber 26, the gate valve 25 of the first film forming chamber 26 is closed and evacuating is carried out for a predetermined time. The switch valve 44 for the gas supply section 43 is opened by the controller 45 and material gases such as $SiH_4$, $NH_3$ and $N_2$ are introduced into the first film forming chamber 26. While controlling the opening degree of the throttle valve 42 for the suction pump 41 through the controller 45, pressure in the chamber 26 is adjusted to 3.5 Torr. High frequency power is applied to generate discharge and the gate insulator layer 63, which is $Si_xN_y$ film, is formed on the glass substrate 61 at 350° C.

The throttle valve 42 for the suction pump 41 is opened for a previously-set time by the controller 45 to exhaust the chamber 26 to vacuum. The switch valve 44 for the gas supply section 43 is opened and material gases such as $SiH_4$ and $H_2$ are again introduced into the chamber 26. Pressure in chamber 26 is adjusted to 1 Torr and the semiconductor layer 64, which is on a-Si film is, formed on the gate insulator layer 63 at 300° C. In order to control pressure in the chamber 26 at the evacuating time, the switch valve 44 may be arranged such that material gases continue to be introduced into the chamber 26 while opening the switch valve 44 for the gas supply section 43 through the controller or that high frequency power continues to be applied.

After the semiconductor layer 64 is formed, the throttle valve 42 for the suction pump 41 is opened for a predetermined time by the controller 45 and evacuating is carried out in the chamber 26. The switch valve 44 for the gas supply section 43 is opened and material gases such as $SiH_4$, $NH_3$ and $H_2$ are again introduced into the chamber 26. Pressure in the chamber 26 is adjusted to 0.5 Torr and the etching stopper layer 65, which is $Si_xN_y$ film, is formed on the semiconductor layer 64 at 290° C. In order to control pressure at the evacuating time, the switch valve 44 may be similarly arranged also in this case such that material gases continue to be introduced while opening the switch valve 44 for the gas supply section 43 through the controller 45 or that such high frequency power continues to be applied.

After these gate insulator, semiconductor and etching stopper layers 63, 64 and 65 are formed, evacuating is again carried out in the chamber 26. Gate valves 25 and 23 of first film forming and carry-in and -out chambers 26 and 21 are opened and the substrate, on which film layers have been laminated, is returned from the first film forming chamber 26 into the carry-in and -out chamber 21 by the single substrate carrying mechanism in the transfer chamber 24. Same processes or steps are carried out in the second film forming chamber 29.

After the predetermined etching, the source and drain electrodes 66 and 67 are formed.

Temperature control of the substrate will be described referring to FIG. 7 which shows temperature change in the substrate caused when the gate insulator and semiconductor layers 63 and 64 are formed in the first film forming chamber 26.

The throttle valve 42 for the suction pump 41 is opened by the controller 45 and the temperature of 350° C., at which $Si_xN_y$ film is formed as the first film, is lowered to near 300° C. in the first film forming chamber 25 for the evacuating time $t_1$, (=10 sec.) after the film forming step. At the same time, the throttle valve 43 for the gas supply section 42 is opened by the controller 45 and the substrate temperature is made stable at 300° C. and film forming is carried out in the first film forming chamber 26 for the second a-Si film material gases introducing and pressure adjusting time $t_4$ (=5 sec.). The time needed to change substrate settings is 15 sec. in this case. Material gases may continue to be introduced into the first film forming chamber 26 to control time pressure for the evacuating time $t_1$, and the material gases introducing and pressure adjusting time $t_4$. In this case, discharging condition may be kept.

In the case where two or more different film forming processes or steps are continuously carried out in the single first film forming chamber 26, therefore, the time needed to control substrate temperature at the film forming step can be minimized by optimizing the following parameters: the evacuation waiting time until the start of each material gas introducing and pressure adjusting step, the value of pressure set at the pressure adjusting time, the evacuating time and value of pressure set after the film forming step, and the substrate carrying time. When film forming is continuously carried out under two or more process conditions, the time needed to control substrate temperature can be shortened without requiring the heating or cooling chamber to change the temperature of the substrate.

According to the above-described embodiment, the time needed to control substrate temperature can be made shortened without requiring a heating or cooling chamber to change substrate temperature by controlling one or more of the following: the evacuating time $t_1$, and value of pressure set in the first and second film forming chambers 26 and 29 after the film forming step, the time $t_2$ for carrying the substrate from the first film forming chamber 26 into the second one 29 by the single substrate carrying mechanism in the transfer chamber 24, the pressure in the transfer chamber at the substrate carrying time, the evacuation waiting time $t_3$ and value of pressure set before the film forming step, and the material gases introducing and pressure adjusting time $t_4$ before the film forming step. The continuous film forming operation is thus conducted under different film forming conditions.

Further, film forming is made possible by different substrate temperature processes while setting the substrate heating heaters 27 and 30 at the same temperatures, and a plurality of different film forming processes can be continuously realized in the same first or second film forming chamber 26 or 29. The chemical vapor deposition apparatus can be thus made lower in cost and smaller in size. In addition, the space the apparatus occupies can be made smaller. The apparatus can also be made higher in productivity.

The effectiveness of the first or second film forming chamber 26 or 29 is improved by arranging the clearance between the matrix array substrate B and the substrate heating heater 27 or 30 smaller than 0.3 mm. When an exhaust system, by which pressure, smaller than 10 mTorr, can be attained, is used and pressure at the film forming time is set controllable in a range of 0.1–5 Torr, the temperature of the matrix array substrate B, which is $Si_xN_y$ film, can be controlled optional in a range of 300° C.–370° C. while setting the substrate heating heaters 27 and 30 at 400° C. in temperature.

Property change of the amorphous semiconductor, particularly its mobility deterioration can be controlled when temperature at the laminated films forming time after the amorphous semiconductor film forming step is made lower than that at the amorphous semiconductor film forming time particularly in the case where laminated film layers including the amorphous semiconductor film are to be continuously formed. When temperature is successively lowered as seen in the above-described embodiment, therefore, laminated film layers can be continuously formed without changing the property of the amorphous semiconductor layer. This is considerably more advantageous in producing thin film transistors.

Although film forming has been carried out while successively lowering the temperature of the matrix array substrate B in the case of the above-described embodiment, film forming temperature may be kept certain or successively raised.

X and y of silicon nitride ($Si_xN_y$) are usually replaced by 3 and 4 but silicon nitride sometimes includes a small amount of N or H. Instead of silicon nitride, therefore, silicon oxide ($Si_xO_y$) may be used. The kind of film used can be thus made optional.

Further, semiconductor devices thus produced can be used as solar batteries and others in addition to TFTs.

Furthermore, plural layers of film may be formed in a single film forming chamber, a layer of film may be formed in it or these processes may be combined with each other.

According to the vapor deposition method, substrates are carried individually. Therefore, no tray is needed and heat capacity can be made smaller and substrate temperature can be more easily changed at a shorter time. In addition, substrate temperature is controlled while keeping the heating temperature of the heater constant and controlling at least one of the value of pressure set in the film forming chamber and the time for carrying the substrate. This makes it unnecessary to directly heat or cool the substrate. Therefore, the processing cost can be made lower and substrate temperature can be more easily changed.

According to the vapor deposition method of another embodiment of the present invention, substrate temperature is controlled to a different temperature while controlling the value of pressure set in the film forming chamber. Even though the substrate heating heater has a large heat capacity, therefore, substrate temperature can be changed in a shorter time because it is changed while controlling the value of the pressure set.

According to the vapor deposition method, the temperature of the substrate heating heater is made constant when substrate temperature is to be controlled to a different setting. The heating temperature of the substrate heating heater is thus made constant in the film forming chamber. In short, substrate temperature is changed while keeping constant the heating temperature of the substrate heating heater which has a large heat capacity. Therefore, substrate temperature can be changed in a shorter time.

According to the vapor deposition method, the heat capacity of the substrate heating heater is larger than that of the substrate. When pressure is changed, therefore, temperature change is more likely in the substrate than in the substrate heating heater. Substrate temperature can be thus more easily changed.

According to the vapor deposition method, a clearance is provided between the substrate and the substrate heating heater. Temperature surrounding the substrate thus changes more quickly than that in the substrate heating heater. Because of this clearance substrate temperature can be more easily set to a predetermined value in a shorter time.

According to the vapor deposition apparatus, the tray which has a large heat capacity is not needed in the case of the single substrate carrying type. Heat capacity can be thus made smaller and substrate temperature can be more easily changed in a shorter time. In addition, substrate temperature can be controlled while controlling at least one of the evacuation time and value of pressure set before and after film forming is started in the film forming chamber, the value of pressure set at the film forming time in the film forming chamber, the time for carrying the substrate, and the pressure in the transfer chamber. Therefore, substrate temperature control can be achieved in a shorter time without using any heating or cooling chamber to change the temperature of the substrate. Further, a plurality of different film forming processes or steps can be continuously made in a single film forming chamber. Accordingly, the apparatus can be made lower in cost, smaller in size and higher in productivity.

According to the vapor deposition apparatus, the film forming chamber has a heater for heating the substrate. Temperature in the film forming chamber can thus be set optional.

According to the vapor deposition apparatus, the heating temperature of the heater in the film forming chamber is made constant. Therefore, substrate temperature can be changed for a shorter time because this temperature change is made while keeping constant the heating temperature of the heater which has a relatively large heat capacity.

According to the vapor deposition apparatus, substrate temperature is successively controlled in a single film forming chamber and plural different thin film forming processes or steps are continuously carried out in the chamber. Different kinds of thin film layers can thus be more easily laminated in the single film forming chamber.

According to the vapor deposition apparatus, at least one layer of semiconductor thin film is included in the thin film layers laminated. Therefore, semiconductor products can be more easily made.

According to the vapor deposition apparatus, the substrate is a glass one. It has a low thermal conductivity and temperature gradient is caused in it. Therefore, the temperature of thin film layers can be more easily controlled by the atmosphere surrounding them.

What is claimed is:

1. A chemical vapor deposition method for applying a plurality of vapor-deposited films on a glass substrate, said method comprising the steps of:

vapor-depositing a first film formed of a first material on a glass substrate having a first temperature in a first film-forming chamber;

carrying the glass substrate from the first film-forming chamber to a second film-forming chamber having a heater that operates at a constant operating temperature;

promoting heat conduction between the glass substrate and the heater by setting a total vapor pressure in the second film-forming chamber to a range of from 0.1 Torr to 5 Torr;

controlling the glass substrate temperature, which is disposed in the second film-forming chamber, to a second temperature by changing the total vapor pressure in the second film-forming chamber while maintaining the total vapor pressure within the range of from 0.1 Torr to 5 Torr and while maintaining the operating temperature of the heater constant; and vapor-depositing a second film formed of a second material, which is different from the first material of the first film, on the glass substrate having the second temperature, wherein said step of changing the glass substrate temperature to the second temperature is conducted in a shorter amount of time than had the total vapor pressure in the second film-forming chamber not been set to the range of from 0.1 Torr to 5 Torr.

2. The chemical vapor deposition method according to claim 1, wherein said step of changing the glass substrate temperature from the first temperature to the second temperature is conducted in not more than 5 minutes.

3. A chemical vapor deposition method for applying a plurality of vapor-deposited films on a glass substrate, said method comprising the steps of:

vapor-depositing a first film formed of a first material on a glass substrate having a first temperature in a film-forming chamber, the film-forming chamber provided with a heater operating at an operating temperature;

promoting heat conduction between the glass substrate and the heater by setting a total vapor pressure in the film-forming chamber to a range of from 0.1 Torr to 5 Torr after vapor depositing the first film;

controlling the glass substrate temperature, which is disposed in the film-forming chamber, from the first temperature to a second temperature by changing the total vapor pressure in the film-forming chamber while maintaining the total vapor pressure within the range of from 0.1 Torr to 5 Torr and while maintaining the operating temperature of the heater constant; and vapor depositing a second film formed of a second material, which is different from the first material of the first film, on the glass substrate having the second temperature in the film-forming chamber, wherein said step of changing the glass substrate temperature from the first temperature to the second temperature is conducted in a shorter amount of time than had the total vapor pressure in the film-forming chamber not been set to the range of from 0.1 Torr to 5 Torr.

4. The chemical vapor deposition method according to claim 3, wherein the heater of the film-forming chamber is maintained at a constant operating temperature during said changing step.

5. The chemical vapor deposition method according to claim 3, wherein the heater of the film-forming chamber has a heat capacity larger than that of the glass substrate.

6. The chemical vapor deposition method according to claim 3, wherein each of said steps of vapor depositing includes positioning the substrate to oppose the heater with a clearance therebetween.

* * * * *